United States Patent
Akahane et al.

(10) Patent No.: US 9,163,144 B2
(45) Date of Patent: Oct. 20, 2015

(54) SILICONE RESIN COMPOSITION, SILICONE LAMINATED SUBSTRATE USING THE SAME, METHOD FOR PRODUCING THE SAME, AND LED DEVICE

(71) Applicant: SHIN-ETSU CHEMICAL CO., LTD., Tokyo (JP)

(72) Inventors: Saiko Akahane, Annaka (JP); Shigeo Yamaguchi, Annaka (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 177 days.

(21) Appl. No.: 13/961,391

(22) Filed: Aug. 7, 2013

(65) Prior Publication Data
US 2014/0120793 A1    May 1, 2014

(30) Foreign Application Priority Data
Oct. 29, 2012   (JP) .................. 2012-237462

(51) Int. Cl.

| | |
|---|---|
| *C08G 77/08* | (2006.01) |
| *C08L 83/04* | (2006.01) |
| *C03C 25/00* | (2006.01) |
| *H01L 33/56* | (2010.01) |
| *H01L 33/48* | (2010.01) |

(52) U.S. Cl.
CPC .............. *C08L 83/04* (2013.01); *C03C 25/00* (2013.01); *H01L 33/56* (2013.01); *H01L 33/483* (2013.01); *H01L 2933/005* (2013.01); *Y10T 428/249921* (2015.04); *Y10T 442/2992* (2015.04)

(58) Field of Classification Search
CPC ...................................................... C08L 83/04
See application file for complete search history.

(56) References Cited

U.S. PATENT DOCUMENTS

| | | | |
|---|---|---|---|
| 2010/0065880 A1 | 3/2010 | Kashiwagi et al. | |
| 2010/0276721 A1* | 11/2010 | Yoshitake et al. | 257/99 |
| 2012/0146088 A1* | 6/2012 | Tanikawa et al. | 257/100 |
| 2014/0194019 A1* | 7/2014 | Greer et al. | 442/150 |
| 2015/0126700 A1 | 5/2015 | Kamuro et al. | |

FOREIGN PATENT DOCUMENTS

| | | |
|---|---|---|
| JP | A-2004-182851 | 7/2004 |
| JP | A-2010-089493 | 4/2010 |
| JP | 5667326 B2 | 2/2015 |
| WO | 2007/119627 A1 | 10/2007 |

OTHER PUBLICATIONS

Jun. 23, 2015 Office Action issued in Japanese Patent Application No. 2012-237462.
Aug. 11, 2015 Office Action issued in Japanese Patent Application No. 2012-237462.

* cited by examiner

*Primary Examiner* — Margaret Moore

(57) ABSTRACT

The invention provides a silicone resin composition for producing a silicone laminated substrate by being impregnated in a glass cloth and cured therein, comprising: (A) an organopolysiloxane with a 3-dimensional network structure composed of an $R^1SiO_{1.5}$ unit and an $R^2SiO_{1.5}$ unit and a T unit represented by an $RSiO_{1.5}$ unit; (B) an organohydrogenpolysiloxane composed of an $R^1SiO_{1.5}$ unit, an $R^1{}_2SiO$ unit and an $R^1{}_aH_bSiO_{(4-a-b)/2}$ unit; (C) a platinum group metal catalyst; and (D) a filler. There can be a silicone resin composition having a high glass transition temperature, a silicone laminated substrate excellent in properties such as heat resistance and weatherability having low thermal expansion coefficient and suppressed warp and deformation, a method for producing the same and an LED device.

11 Claims, 1 Drawing Sheet

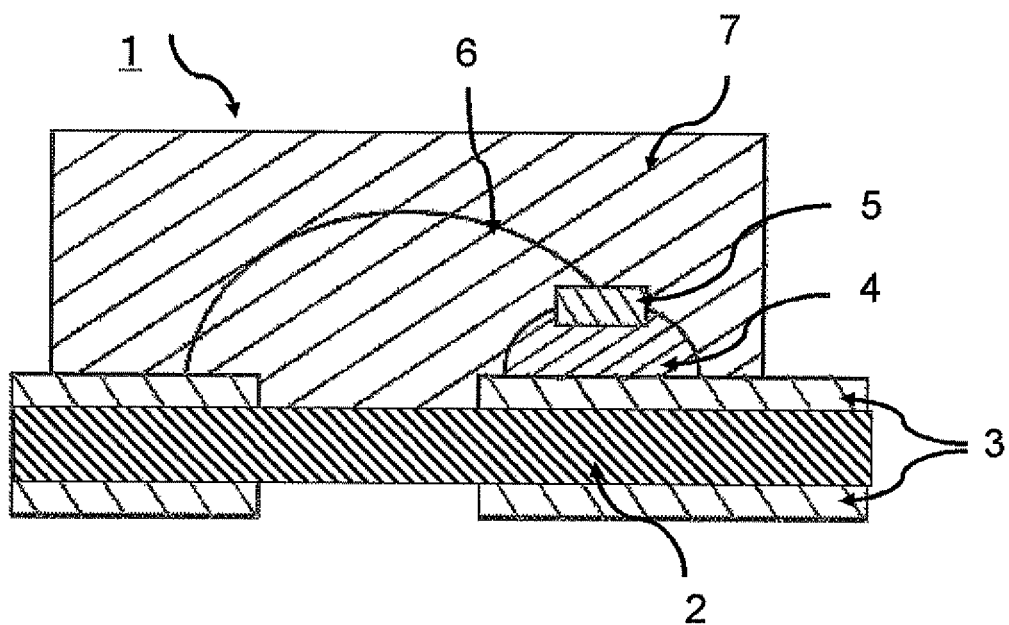

1

SILICONE RESIN COMPOSITION, SILICONE LAMINATED SUBSTRATE USING THE SAME, METHOD FOR PRODUCING THE SAME, AND LED DEVICE

BACKGROUND OF THE INVENTION

1. Field of the Invention

The present invention relates to silicone resin composition, silicone laminated substrate using the same, a method for producing the same and an LED device using the silicone laminated substrate.

2. Description of the Related Art

An epoxy resin impregnated in a glass cloth is frequently used as a mounting substrate such as an LED mounting substrate and electrical and electronic equipment. Unfortunately, such a mounting substrate can deteriorate due to a growing calorific value of an LED device itself from the use of a lead-free LED device and an increase in the luminance LED in the LED device. Accordingly, an LED device is required to have higher heat resistance and weatherability.

Additionally, introduction of more functional electronic devices leads to high density integration and high density mounting of an electronic component and thus development of a thinner laminated substrate. Despite this technical development, substrate thinning can cause warp and consequently such technical problems as connection failure. Warp of a substrate has generally been controlled by filling inorganic filler having small thermal expansion coefficient in large quantities to suppress the thermal expansion coefficient of the entire substrate. However, this method can cause many problems such as reduction in fluidity and reduction in drilling workability (Patent Document 1). Thus, improvement in resin composition is being examined to suppress thermal expansion coefficient.

It has recently been examined that a silicone laminated substrate excellent in properties such as heat resistance and weatherability is used as a mounting substrate such as an LED mounting substrate and electrical and electronic equipment (Patent Document 2). Nevertheless, a silicone resin having a lower glass transition temperature than an epoxy resin used in a conventional mounting substrate is prone to warp by substrate thinning.

PRIOR ART DOCUMENT

Patent Document

Patent Document 1: Japanese Patent Publication Laid-Open No. 2004-182851

Patent Document 2: Japanese Patent Publication Laid-Open No. 2010-89493

SUMMARY OF THE INVENTION

The present invention was made to solve the problems mentioned above, and was intended to provide a silicone resin composition having a high glass transition temperature, a silicone laminated substrate excellent in properties such as heat resistance and weatherability having low thermal expansion coefficient and suppressed warp and deformation using the same, a method for producing the same and an LED device.

To solve the problems as mentioned above, the present invention provides a silicone resin composition for producing a silicone laminated substrate by being impregnated in a glass cloth and cured therein, the silicone resin composition comprising:

(A) an organopolysiloxane with a 3-dimensional network structure composed of a T unit represented by an $RSiO_{1.5}$ unit (R is $R^1$ or $R^2$) and an $R^1SiO_{1.5}$ unit ($R^1$ represents a linear, a branched or a cyclic alkyl group having 1 to 10 carbon atoms and an aryl group having 6 to 10 carbon atoms.) and an $R^2SiO_{1.5}$ unit ($R^2$ represents an alkenyl group having 2 to 8 carbon atoms.);

(B) an organohydrogenpolysiloxane composed of an $R^1SiO_{1.5}$ unit, an $R^1{}_2SiO$ unit and an $R^1{}_aH_bSiO_{(4-a-b)/2}$ unit ($R^1$ represents the same as before, "a" represents 0, 1 or 2, "b" represents 1 or 2, and a+b represents 2 or 3.), wherein the molar ratio of a hydrogen atom bonded to a silicon atom in the (B) component relative to the total of the alkenyl group in the (A) component is 0.1 to 4.0;

(C) a platinum group metal catalyst, wherein the amount is an effective amount; and (D) a filler, wherein the amount is 900 parts by mass or less relative to 100 parts by mass totaling the (A) and (B) components.

Such a silicone resin composition contains an organopolysiloxane ((A) component) with a 3-dimensional network structure composed of a T unit, and a cured product thereof has high glass transition temperature. A silicone laminated substrate produced by this method has low thermal expansion coefficient and suppressed warp and deformation and is excellent in properties such as heat resistance and weatherability.

It is preferable that the glass transition temperature of a cured product of the silicone resin composition be 150° C. or more.

By using a silicone resin composition having such high glass transition temperature, a cured product thereof is preferably used for producing a silicone laminated substrate having a high heat resistance and suppressed warp and deformation.

It is preferable that the $R^1$ be preferably a methyl group, an ethyl group, a propyl group, a cyclohexyl group or a phenyl group, and the $R^2$ be a vinyl group or an allyl group.

Such a silicone resin composition can be preferably used for producing a silicone laminated substrate.

It is preferable that either or both of the (A) and (B) components contain a silanol group.

Either or both of the (A) and (B) components have high adhesive property and can be preferably used.

It is also preferable that the (B) component have a continuous $R^1{}_2SiO$ unit.

The (B) component has a branch structure by an $R^1SiO_{1.5}$ unit in a polymer molecule and can elongate the polymer molecule in a linear manner by a continuous $R^1{}_2SiO$ unit.

The (D) component preferably contains either or both of (D1) and (D2):

(D1) an inorganic filler other than a white pigment, wherein the amount is 600 parts by mass or less relative to 100 parts by mass totaling the (A) and (B) components; and (D2) a white pigment, wherein the amount is 1 to 300 parts by mass relative to 100 parts by mass totaling the (A) and (B) components.

Such a silicone resin composition can efficiently suppress the linear expansion coefficient of a silicone laminated substrate and improve the strength of the substrate, and can be made white-colored according to an intended use and can preferably be used for producing a silicone laminated substrate.

It is preferable that the (D2) component be titanium dioxide or zinc oxide or combination thereof.

The (D1) and (D2) components can efficiently make a substrate white-colored and is preferably used for an optical device.

Further, it is preferable that the silicone resin composition be in the form of solid at room temperature.

Such a silicone resin composition can readily be handled and can more preferably be used for producing a silicone laminated substrate.

The present invention provides a silicone laminated substrate having a glass cloth and a cured product of a silicone resin composition impregnated in the glass cloth, wherein the silicone resin composition is the above-described silicone resin composition.

Such a silicone laminated substrate has low thermal expansion coefficient and suppressed warp and deformation and is excellent in properties such as heat resistance and weatherability.

The present invention provides a method for producing a silicone laminated substrate, comprising the steps of:

Impregnating the above silicone resin composition in a glass cloth with dissolved and dispersed in a solvent;
removing the solvent from the glass cloth by evaporation; and
heat-curing the silicone resin composition impregnated in the glass cloth under pressurized molding.

Such a method for producing a silicone laminated substrate can readily produce a silicone laminated substrate excellent in properties such as heat resistance and weatherability having suppressed warp and deformation.

The present invention provides an LED device comprising: the above silicone laminated substrate; and an LED chip mounted on the silicone laminated substrate.

Such an LED device can preferably be used as an LED device excellent in properties such as heat resistance and weatherability.

The silicone resin composition according to the present invention can preferably be used for producing a silicone laminated substrate excellent in properties such as heat resistance and weatherability having high glass transition temperature and low thermal expansion coefficient. Accordingly, a silicone laminated substrate produced by this method is preferable for a light-emitting device such as an LED.

BRIEF DESCRIPTION OF THE DRAWINGS

FIG. 1 is a sectional view showing one example of an LED device of the present invention.

DETAILED DESCRIPTION OF THE PREFERRED EMBODIMENTS

The present invention will be described in more detail.

As mentioned above, development of a silicone resin composition having high glass transition temperature has been demanded to produce a silicone laminated substrate excellent in properties such as heat resistance and weatherability having low thermal expansion coefficient and suppressed warp and deformation.

Inventors of the present invention carried out an extensive investigation to find that a silicone resin composition for producing a silicone laminated substrate by being impregnated in glass cloth and cured therein, comprising:

(A) an organopolysiloxane with a 3-dimensional network structure composed of a T unit represented by an $RSiO_{1.5}$ unit (R is $R^1$ or $R^2$) and an $R^1SiO_{1.5}$ unit ($R^1$ represents a linear, a branched or a cyclic alkyl group having 1 to 10 carbon atoms and an aryl group having 6 to 10 carbon atoms.), an $R^2SiO_{1.5}$ unit ($R^2$ represents an alkenyl group having 2 to 8 carbon atoms.);

(B) an organohydrogenpolysiloxane composed of an $R^1SiO_{1.5}$ unit, an $R^1{}_2SiO$ unit and an $R^1{}_aH_bSiO_{(4-a-b)/2}$ unit ($R^1$ is the same as before, "a" represents 0, 1 or 2, "b" represents 1 or 2, and a+b represents 2 or 3.), wherein the molar ratio of a hydrogen atom bonded to a silicon atom in the (B) component relative to the total of the alkenyl group in the (A) component is 0.1 to 4.0;

(C) a platinum group metal catalyst, wherein the amount is an effective amount; and (D) a filler, wherein the amount is 900 parts by mass or less relative to 100 parts by mass totaling the total (A) and (B) components, wherein the silicone resin composition has a high glass transition temperature, and a silicone laminated substrate produced by this method has low thermal expansion coefficient and suppressed warp and deformation and is excellent in properties such as heat resistance and weatherability.

The present invention will be described in detail, but is not restricted thereto.

Herein, "room temperature" means 15 to 30° C. "Semi-solid" means a plastic and non-fluid state of a liquid or a solid presented by external factors such as temperature, stress and strain. Ph represents a phenyl group, Me represents a methyl group, Et represents an ethyl group, and Vi represents a vinyl group.

Silicone Resin Composition

The silicone resin composition of the present invention comprises the following (A) to (D) components and is preferably used for producing the silicone laminated substrate of the present invention. The composition of the present invention is preferably in the form of a solid at room temperature and more preferably in the form of a plastic solid at room temperature. The composition in the form of a solid at room temperature is easy to handle.

Each component contained in the silicone resin composition of the present invention will be described.

—(A) Component—Organopolysiloxane with Resin Structure—

The present invention provides (A) component as essential component: an organopolysiloxane with a resin structure (3-dimensional network structure) composed of an $R^1SiO_{1.5}$ unit ($R^1$ represents a linear, a branched or a cyclic alkyl group having 1 to 10 carbon atoms and an aryl group having 6 to 10 carbon atoms.) and an $R^2SiO_{1.5}$ unit ($R^2$ represents an alkenyl group having 2 to 8 carbon atoms.), wherein at least part of the $R^1SiO_{1.5}$ unit and the $R^2SiO_{1.5}$ unit forms continuous repeating units.

The (A) component is an organopolysiloxane with a 3-dimensional network structure composed of a T unit represented by an $RSiO_{1.5}$ unit (R is $R^1$ or $R^2$). If the $R^1$ is a branched alkyl group or a cyclic alkyl group (cycloalkyl group), the alkyl group has 3 to 10 carbon atoms.

The structure in which at least part of the above $R^1SiO_{1.5}$ unit and the $R^2SiO_{1.5}$ unit forms continuous repeating units means an organopolysiloxane chain structure with a 3-dimensional network structure composed of a T unit represented by the following general formula (1):

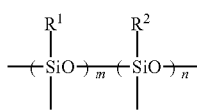
(1)

wherein "m" represents an integer of 36 to 360, and "n" represents an integer of 4 to 40.

An $R^1SiO_{1.5}$ unit and an $R^2SiO_{1.5}$ unit branch or 3-dimensionally network a polymer molecule in a molecule of the (A) component. $R^2$ of the $R^2SiO_{1.5}$ unit (particularly, a vinyl group or an allyl group) cures the composition of the present invention by subjecting a hydrogen atom (SiH group) bonded to a silicon atom of an $R^1_aH_bSiO_{(4-a-b)/2}$ unit of the later-described (B) component to hydrosilylation addition reaction.

The molar ratio of two essential siloxane units of the (A) component: $R^1SiO_{1.5}$ unit and $R^2SiO_{1.5}$ unit is preferably 95 to 50:50 to 5, and more preferably 90 to 70:30 to 10 (100 in total) in view of properties of a cured product obtained.

The weight average molecular weight of the (A) component converted into polystyrene by gel-permeation chromatography (GPC) is in the form of a solid or a semi-solid preferably in the range of 1,000 to 100,000, and more preferably 4,000 to 10,000.

The organopolysiloxane with such a resin structure can be synthesized by determining a combination of compounds as a raw material of each unit so that the molar ratio is in the range described above and performing co-hydrolysis and condensation in the presence of an acid.

Illustrative example of the raw material of the $R^1SiO_{1.5}$ unit includes $MeSiCl_3$, $EtSiCl_3$, $PhSiCl_3$, chlorosilane such as propyltrichlorosilane and cyclohexyltrichlorosilane, and alkoxysilane such as methoxysilane corresponding to each of these chlorosilanes.

Illustrative example of the raw material of the $R^2SiO_{1.5}$ unit includes chlorosilane having a vinyl group or an allyl group such as $ViSiCl_3$ and alkoxysilane such as methoxysilane corresponding to each of these chlorosilanes.

In the present invention, when the organopolysiloxane of the (A) component is produced by co-hydrolysis and condensation of the above compound as a raw material, the $R^1SiO_{1.5}$ unit may be a siloxane unit whose terminal is a silanol group or a methoxy group. In this case, the organopolysiloxane of the (A) component can contain a silanol group or a methoxy group.

In the present invention, when the organopolysiloxane of the (A) component is produced by co-hydrolysis and condensation of the above compound as a raw material, a siloxane unit having a silanol group may be contained in the $R^1SiO_{1.5}$ unit, the $R^2SiO_{1.5}$ unit or a combination of two or more types thereof. The organopolysiloxane of the (A) component can normally contain about 10 mole % or less (0 to 10 mole %) of siloxane unit containing the silanol group relative to all siloxane units. Illustrative example of the siloxane unit containing the above silanol group includes $(HO)SiO_{1.5}$ unit, $R^1(HO)SiO$ unit, $R^1(HO)_2SiO_{0.5}$ unit, $R^2(HO)SiO$ unit, and $R^2(HO)_2SiO_{0.5}$ unit.

—(B) Component—Organohydrogenpolysiloxane With Resin Structure—

The present invention provides (B) component as essential component: an Organohydrogenpolysiloxane with a resin structure composed of an $R^1SiO_{1.5}$ unit, an $R^1_2SiO$ unit and an $R^1_aH_bSiO_{(4-a-b)/2}$ unit ($R^1$ is the same as before, "a" represents 0, 1 or 2, "b" represents 1 or 2, and a+b represents 2 or 3), wherein at least part of the above $R^1_2SiO$ unit forms continuous repeating units and the Organohydrogenpolysiloxane with a resin structure partially contains a linear siloxane structure whose number of repeating units is 5 to 50, preferably 8 to 40, and more preferably 10 to 35.

A terminal of the organohydrogenpolysiloxane may be a silanol group or a methoxy group.

The structure in which at least part of the above $R^1_2SiO$ unit forms continuous repeating units and the number of the repeating units is 5 to 50 means a linear diorganohydrogenpolysiloxane chain structure represented by the following general formula (2).

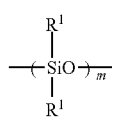
(2)

wherein "m" represents an integer of 5 to 50.

At least part of the entire $R^1_2SiO$ unit present in the organohydrogenpolysiloxane of (B) component, preferably 50 mole % or more (50 to 100 mole %) thereof, and more preferably 80 mole % or more (80 to 100 mole %) thereof forms a chain structure represented by the general formula (2) in a molecule. With continuous $R^1_2SiO$ units, the distance between the crosslinking points becomes long in some sections to impart flexibility. Thus, a cured product can be less brittle and have a high adhesive property for glass cloth and copper foil.

In a molecule of the (B) component, the $R^1_2SiO$ unit elongates a polymer molecule in a linear manner and an $R^1SiO_{1.5}$ unit branches or 3-dimensionally networks a polymer molecule. A hydrogen atom bonded to a silicon in the $R^1_aH_bSiO_{(4-a-b)/2}$ unit cures the composition of the present invention by hydrosilylation addition reaction with an alkenyl group contained in the above (A) component.

The molar ratio of three types of essential siloxane units composed of the (B) component: $R^1SiO_{1.5}$ unit, $R^1_2SiO$ unit and $R^1_aH_bSiO_{(4-a-b)/2}$ unit is preferably 90 to 24:75 to 9:50 to 1, and more preferably 70 to 28:70 to 20:10 to 2 (100 in total) in view of properties of a cured product obtained.

In particular, if the molar ratio of $R^1SiO_{1.5}$ unit and $R^1_2SiO$ unit is 70 to 30:30 to 70 (100 in total), a cured product becomes less brittle and has high adhesive property for glass cloth and copper foil.

The weight average molecular weight of the (B) component converted into polystyrene by GPO is preferably 3,000 to 1,000,000, and more preferably 10,000 to 100,000 in view of workability and properties of a cured product.

The Organohydrogenpolysiloxane with such a resin structure can be synthesized by determining a combination of compound as a raw material of each unit so that the above three types of siloxane units show a required molar ratio in a produced polymer and performing co-hydrolysis and condensation in the presence of an acid.

Illustrative example of the $R^1SiO_{1.5}$ unit's raw material includes $MeSiCl_3$, $EtSiCl_3$, $PhSiCl_3$, chlorosilane such as propyltrichlorosilane and cyclohexyltrichlorosilane and alkoxysilane such as methoxysilane corresponding to each of these chlorosilanes.

Illustrative example of the raw material of the $R^1_2SiO$ unit includes
$ClMe_2SiO(Me_2SiO)_jSiMe_2Cl$,
$ClMe_2SiO(Me_2SiO)_k(PhMeSiO)_LSiMe_2Cl$, ClMe$_2$SiO(Me$_2$SiO)$_k$(Ph$_2$SiO)$_L$SiMe$_2$Cl,
HOMe$_2$SiO(Me$_2$SiO)$_j$SiMe$_2$OH,
HOMe$_2$SiO(Me$_2$SiO)$_k$(PhMeSiO)$_L$SiMe$_2$OH,
HOMe$_2$SiO(Me$_2$SiO)$_k$(Ph$_2$SiO)$_L$SiMe$_2$OH,
MeOMe$_2$SiO(Me$_2$SiO)$_j$SiMe$_2$OMe,
MeOMe$_2$SiO(Me$_2$SiO)$_k$(PhMeSiO)$_L$SiMe$_2$OMe,
MeOMe$_2$SiO(Me$_2$SiO)$_k$(Ph$_2$SiO)$_L$SiMe$_2$OMe wherein "j" represents an integer of 3 to 48 (average), "k" represents an integer of 0 to 47 (average), "L" represents an integer of 1 to 48 (average), and k+L represents an integer of 3 to 48 (average).

Illustrative example of the $R^1{}_aH_bSiO_{(4-a-b)/2}$ unit includes one type of siloxane unit selected from $R^1HSiO$ unit, $R^1{}_2HSiO_{0.5}$ unit, $H_2SiO$ unit, and $R^1H_2SiO_{0.5}$ unit or a combination of two or more types thereof. Illustrative example of the raw material includes chlorosilane such as Me$_2$HSiCl, MeHSiCl$_2$, Ph$_2$HSiCl and PhHSiCl$_2$, and alkoxysilane such as methoxysilane corresponding to each of these chlorosilanes.

In the present invention, when the organohydrogenpolysiloxane of the (B) component is produced by co-hydrolysis and condensation of the above compound as a raw material, the $R^1SiO_{1.5}$ unit may be a siloxane unit whose terminal is a silanol group or a methoxy group. In this case, the organohydrogensiloxane of the (B) component can contain a silanol group or a methoxy group.

In the present invention, when the organohydrogenpolysiloxane of the (B) component is produced by co-hydrolysis and condensation of the above compound as a raw material, siloxane unit having a silanol group is contained in $R^1SiO_{1.5}$ unit, $R^1{}_2SiO$ unit and $R^1{}_aH_bSiO_{(4-a-b)/2}$ unit or a combination of two or more types thereof. The organohydrogenpolysiloxane of the (B) component can contain 10 mole % or less of a siloxane unit containing the silanol group (0 to 10 mole %) relative to all siloxane units. Illustrative example of the siloxane unit containing the above silanol group includes (HO)SiO$_{1.5}$ unit, $R^1$(HO)SiO unit, (HO)$_2$SiO unit, H(HO)SiO unit, H$_2$(HO)SiO$_{0.5}$ unit, $R^1$H(HO)SiO$_{0.5}$ unit, and H(HO)$_2$SiO$_{0.5}$ unit.

The amount of the organohydrogenpolysiloxane of the (B) component to be blended is determined so that the molar ratio of a hydrogen atom bonded to a silicon atom (SiH group) in the (B) component relative to the total of an alkenyl group in the (A) component is 0.1 to 4.0, more preferably 0.5 to 3.0, and much more preferably 0.8 to 2.0. If the molar ratio is under 0.1, the curing reaction doesn't proceed, thereby making it hard to obtain a cured product of a silicone resin composition. If the molar ratio is over 4.0, an unreacted SiH group remains in the cured product in large quantities and thus physical properties of the cured product of the silicone resin composition can change with time.

In the present invention, either or both of the (A) and (B) components preferably contain a silanol group to impart adhesive property. The amount of siloxane unit having the silanol group is about 40 mole % or less (0 to 40 mole %) relative to the total of the siloxane unit in the organopolysiloxane of the (A) component or the organohydrogenpolysiloxane of the (B) component.

—(C) Component—Platinum Group Metal Catalyst—

The catalyst component is platinum-based, palladium-based or rhodium-based catalyst which is blended so as to generate a curing addition reaction of the composition of the present invention. The catalyst can be used as any conventionally-known catalyst that promotes hydrosilylation reaction. Illustrative example thereof includes platinum-based catalyst such as platinum, platinum black and chloroplatinic acid, e.g. H$_2$PtCl$_6$.pH$_2$O, K$_2$PtCl$_6$, KHPtCl$_6$.pH$_2$O, K$_2$PtCl$_4$, K$_2$PtCl$_4$.ph$_2$O, PtO$_2$.pH$_2$O, PtCl$_4$.pH$_2$O, PtCl$_2$, H$_2$PtCl$_4$.pH$_2$O ("p" represents a positive integer), complex of these substances and hydrocarbon such as olefin, alcohol or vinyl group-containing organopolysiloxane in view of cost performance. These catalysts can be used alone or in combination of two or more types thereof.

The amount of the (C) component to be blended may be an effective amount for curing, normally in the range of 0.1 to 500 ppm, and more preferably 0.5 to 100 ppm converted into mass as platinum group metal relative to the total of the (A) and (B) components.

—(D) Component—Filler—

A filler of (D) component is added to the composition of the present invention to suppress the linear expansion coefficient of the silicone laminated substrate of the present invention and improve the strength of the substrate. Illustrative example of the (D) component may be known filler, including silica such as precipitated silica, fumed silica, fused silica, fused spherical silica, and crystalline silica; fumed titanium dioxide, zinc oxide, silicon nitride, aluminum nitride, boron nitride, antimony trioxide, alumina, zirconium oxide, zinc sulfide, magnesium oxide, and barium sulfate. Illustrative example of the reinforcing inorganic filler includes silica such as precipitated silica and fumed silica; fumed titanium dioxide, alumina, and aluminum nitride. Illustrative example of the non-reinforcing inorganic filler includes calcium carbonate, calcium silicate, titanium dioxide, ferric oxide, carbon black, and zinc oxide. The (D) component can be alone or in combination with two or more types thereof.

The amount of the (D) component to be blended is in the range of 900 parts by mass or less (0 to 900 parts by mass) per 100 parts by mass totaling the (A) and (B) components in view of the linear expansion coefficient and strength of the silicone laminated substrate obtained, and preferably 600 parts by mass or less (0 to 600 parts by mass), and 10 to 600 parts by mass, and more preferably 50 to 500 parts by mass.

The filler containing the following (D1) and/or (D2) components is preferably used in the silicone laminated substrate of the present invention as the (D) component, and particularly in a silicone laminated substrate used in an LED device.

(D1) Inorganic Filler (D1) is an inorganic filler other than a white pigment and added to the composition of the present invention to suppress the linear expansion coefficient of the silicone laminated substrate of the present invention and improve the mechanical strength of the substrate. Illustrative example of the (D1) component can normally include ones blended into a silicone resin composition, and may be any known inorganic filler including silica such as fused silica, fused spherical silica, and crystalline silica; silicon nitride, aluminum nitride, boron nitride, and antimony trioxide, and more preferably fused silica and fused spherical silica. The (D1) component can be used alone or in combination with two or more types thereof.

The average particle diameter and shape of the (D1) component are not particularly restricted. The average particle diameter of the (D1) component is normally 0.5 to 50 μm, preferably 1 to 10 μm, and more preferably 1 to 5 μm in view of molding and fluid properties of a silicone resin composition obtained. The average particle diameter can be calculated as a mass average $D_{50}$ (or median diameter) in particle size distribution measurement by laser diffraction method.

The inorganic filler of the (D1) component may be subjected to surface treatment with a coupling agent such as silane coupling agent and titanate coupling agent beforehand to increase the bonding strength of a resin and inorganic filler. Illustrative example of these coupling agents preferably includes γ-glycidoxypropyltrimethoxysilane, γ-glycidoxypropylmethyldiethoxysilane, epoxy-functional alkoxysilane such as β-(3,4-epoxycyclohexyl)ethyltrimethoxysilane; amino-functional alkoxysilane such as N-β(aminoethyl)γ-aminopropyltrimethoxysilane, γ-aminopropyltriethoxysilane, and N-phenyl-γ-aminopropyltrimethoxysilane; mercapto-functional alkoxysilane such as γ-mercaptopropyltrimethoxysilane. The amount of the coupling agent used for surface treatment and the method thereof are not particularly restricted.

The inorganic filler of the (D1) component can be added to the composition of the present invention with the inorganic filler dispersed in organic solvent as slurry.

The amount of the (D1) component to be blended is preferably in the range of 600 parts by mass or less (0 to 600 parts by mass) per 100 parts by mass totaling the (A) and (B) components, 10 to 600 parts by mass, and more preferably 50 to 500 parts by mass in view of the linear expansion coefficient and strength of a silicone laminated substrate obtained.

(D2) White Pigment

The (D2) component is a white pigment, and used as white coloring agent for whitening a cured product of a silicone resin composition obtained. When a silicone laminated substrate obtained is required optical reflection, the (D2) component is added to the composition of the present invention in order to increase the optical reflectance of the silicone laminated substrate. However, when a silicone laminated substrate obtained is required no optical reflection, the (D2) component may not be added to the composition of the present invention. Herein, "silicone laminated substrate requires optical reflection" means that the optical reflectance of the silicone laminated substrate is preferably 80% or more (80 to 100%) over entire visible light region as later described. Illustrative example of the (D2) component is not specifically restricted as long as it is conventionally-used known white pigment, but preferably includes titanium dioxide, alumina, zirconium oxide, zinc sulfide, zinc oxide, magnesium oxide, barium sulfate, and combination of two or more types thereof. The combination is titanium dioxide and at least one type of other specifically illustrated white pigments. More preferable example thereof includes titanium dioxide, alumina, and magnesium oxide, and the titanium dioxide is much more preferable. The crystal form of the titanium dioxide may be rutile type, anatase type or brookite type, but rutile type is preferably used.

The average particle diameter of the white pigment is preferably 0.05 to 10.0 µm, more preferably 0.1 to 5.0 µm, and much more preferably 0.1 to 1.0 µm. Also, in order to improve mixing and dispersing properties of the white pigment of the (D2) component and the resin components of the (A) and (B) components and the inorganic filler of the (D1) component, the white pigment of the (D2) component may be surface-treated with hydroxide such as Al hydroxide and Si hydroxide beforehand. The average particle diameter, as described above, can be calculated as mass average $D_{50}$ (or median diameter) in particle size distribution measurement by laser diffraction method. The (D2) component can be used alone or in combination with two or more types thereof.

The amount of the (D2) component to be blended is preferably 1 to 300 parts by mass per 100 parts by mass totaling (A) and (B) components, more preferably 3 to 200 parts by mass, and much more preferably 10 to 150 parts by mass. If the amount to be blended is below 1 part by mass, the degree of whiteness of a cured product of a silicone resin composition obtained cannot sufficiently be obtained. If the amount to be blended is over 300 parts by mass, the ratio of an inorganic filler of the (D1) component added in order to suppress the linear expansion coefficient of the silicone laminated substrate of the present invention and improve the mechanical strength of the substrate can be too low relative to all inorganic fillers. The amount of a white pigment of the (D2) component is preferably 1 to 50% by mass relative to the total of the silicone resin composition, more preferably 5 to 30% by mass, and much more preferably 10 to 30% by mass.

—Other Components—

Each of known additives, other than the above-described (A) to (D) components, can be blended into the composition of the present invention as required.

Adhesion Auxiliary

An adhesion auxiliary (adhesive property imparting agent) can be added to the composition of the present invention to impart adhesive properties as required. The adhesion auxiliary can be used alone or in combination with two or more types thereof. Illustrative example of the adhesion auxiliary includes linear or cyclic organosiloxane oligomer having 4 to 50, preferably about 4 to 20 silicon atoms containing at least two types, preferably two or 3 types of functionalities, selected from a hydrogen atom (SiH group) bonded to a silicon atom in one molecule, an alkenyl group (e.g. Si—CH=CH$_2$ group) bonded to a silicon atom, and an alkoxysilyl group (e.g. trimethoxysilyl group) and an epoxy group (e.g. glycidoxypropyl group and a 3,4-epoxycyclohexylethyl group) and an organooxysilyl-modified isocyanurate compound represented by the following general formula (3), a hydrolytic condensate thereof (organosiloxane-modified isocyanurate compound) and a combination of two or more types thereof.

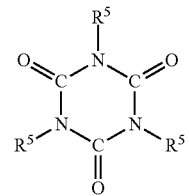

(3)

wherein $R^5$ represents an organic group represented by the following formula (4) or a monovalent hydrocarbon group containing an aliphatic unsaturated bond, and at least one of $R^5$s is an organic group represented by the general formula (4).

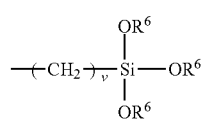

(4)

wherein $R^6$ represents a hydrogen atom or a monovalent hydrocarbon group having 1 to 6 carbon atoms, and "v" represents an integer of 1 to 6, particularly an integer of 1 to 4.

Illustrative example of the monovalent hydrocarbon group containing the aliphatic unsaturated bond of $R^5$ in the general formula (3) includes an alkenyl group having 2 to 8, particularly 2 to 6 carbon atoms such as a vinyl group, an allyl group, a propenyl group, an isopropenyl group, a butenyl group, an isobutenyl group, a pentenyl group and a hexenyl group and a cycloalkenyl group having 6 to 8 carbon atoms such as a cyclohexenyl group. Illustrative example of the monovalent hydrocarbon group of $R^6$ in the general formula (4) includes an alkyl group such as a methyl group, an ethyl group, a propyl group, an isopropyl group, a butyl group, an isobutyl group, a tert-butyl group, a pentyl group, a hexyl group, a cycloalkyl group such as cyclohexyl group, an alkenyl group and a cycloalkenyl group illustrated to describe the above $R^5$, and a monovalent hydrocarbon group such as an aryl group having 1 to 8 carbon atoms such as a phenyl group, particularly 1 to 6 carbon atoms, preferably an alkyl group.

Illustrative example of the adhesion auxiliary includes 1,5-bis(glycidoxypropyl)-1,3,5,7-tetramethylcyclotetrasiloxane, 1-glycidoxypropyl-5-trimethoxysilylethyl-1,3,5,7-tetramethylcyclotetrasiloxane, and compounds represented by the following formulae.

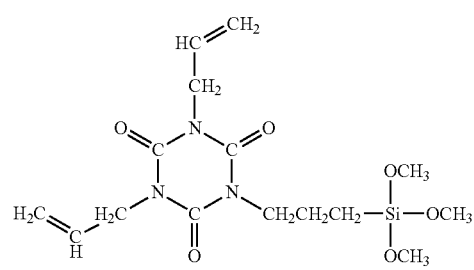

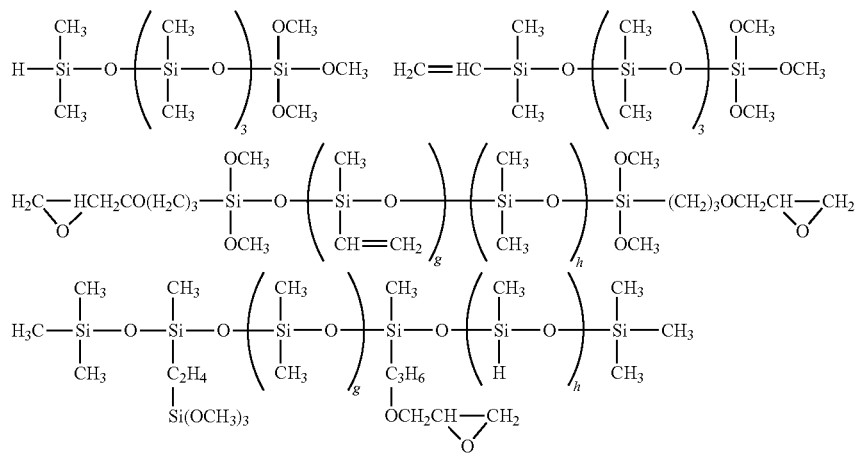

wherein "g" and "h" each represents an integer of 0 to 50, g+h represents 2 to 50, preferably 4 to 20.

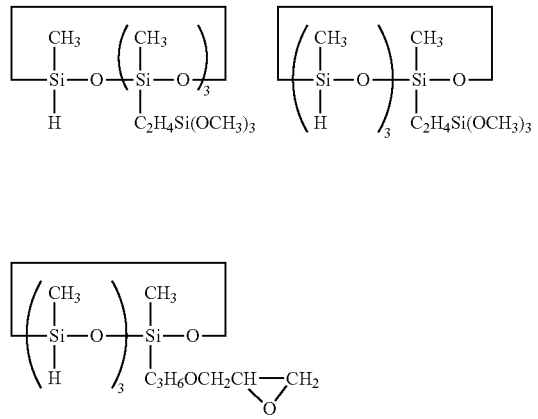

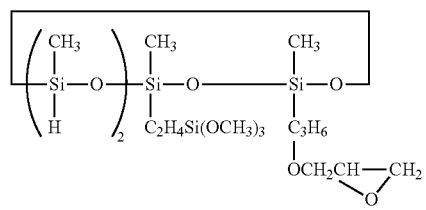

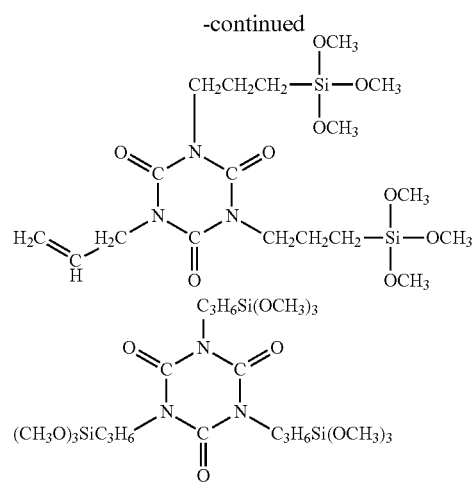

The compounds which provide a particularly favorable adhesive property for a cured product of a silicone resin composition obtained out of the above organosilicon compounds are organosilicon compounds having an alkoxy group bonded to a silicon atom, an alkenyl group or a hydrogen atom (SiH group) bonded to a silicon atom in one molecule.

The amount of the adhesion auxiliary to be blended is normally 10 parts by mass or less (0 to 10 parts by mass) relative to 100 parts by mass of the (A) component, preferably 0.1 to 8 parts by mass, and more preferably 0.2 to 5 parts by mass. Too much amount of adhesion auxiliary to be blended can adversely affect the hardness of the cured product of the silicone resin composition and increase surface tackiness.

Cure Inhibitor

Cure inhibitor can be blended into the silicone resin composition of the present invention as required. The cure inhibitor can be used alone or in combination with two or more types thereof. Illustrative example of the cure inhibitor includes compound selected from organopolysiloxane containing high concentration of vinyl group such as tetramethyltetravinylcyclotetrasiloxane, triallylisocyanurate, alkyl maleate, acetylene alcohols and silane-modified product and siloxane-modified product thereof, hydroperoxide, tetramethylethylenediamine, benzotriazole, and mixture thereof. The cure inhibitor to be added is normally 0.001 to 1.0 parts by mass per 100 parts by mass of the (A) component, preferably 0.005 to 0.5 parts by mass.

Preparation

The silicone resin composition of the present invention is prepared by uniformly mixing required components. The required components are normally preserved in separate 2 liquids to control curing and the 2 liquids are mixed and cured in use. Obviously, the cure inhibitor such as acetylene alcohol as stated above can be added in small quantities to be used as one liquid. The silicone resin composition of the present invention may be prepared as solution or dispersion liquid by uniformly mixing the (A) to (C) components to obtain a base composition, adding solvent such as toluene, xylene and heptane to the base composition, and adding the (D) component thereto. The (D) component contains the (D1) and/or (D2) components and the silicone resin composition is prepared after obtaining base composition by uniformly mixing the (A) to (C) components. After adding a solvent such as toluene, xylene and heptane to the base composition and further adding the (D1) and/or (D2) components thereto, the silicone resin composition may be prepared as dispersion liquid.

Glass Transition Temperature

Generally, a silicone resin composition is required to meet standards of thermal shock cycle test, and the test is conducted in the temperature range of −60 to 140° C. Thus, the silicone resin composition of the present invention having a glass transition temperature of 150° C. or more can effectively meet test standards.

Silicone Laminated Substrate

The silicone laminated substrate of the present invention comprises:

a glass cloth; and a cured product of a silicone resin composition filled in the glass cloth that coats the glass cloth surface.

The thickness of the silicone laminated substrate may be selected according to an intended use of the substrate and the thickness of the glass cloth used for producing the substrate, but not specifically limited, preferably 20 to 2,000 μm, and more preferably 50 to 1,000 μm. Illustrative example of the silicone laminated substrate includes a silicone laminated substrate for an LED device and a silicone laminated substrate for mounting electrical and electronic equipment.

In one embodiment of the present invention, the above silicone laminated substrate is a silicone laminated substrate used in an LED device, and filler of the (D) component contains 600 parts by mass or less of the (D1) component relative to 100 parts by mass totaling the (A) and (B) components, and sometimes 1 to 300 parts by mass of the (D2) component relative to 100 parts by mass totaling the (A) and (B) components. A silicone laminated substrate used in an LED device of the present invention preferably has an optical reflectance of 80% or more (80 to 100%) over entire visible light region, and more preferably 85 to 99%. In the present invention, the optical reflectance is measured by optical reflectance measuring device: X-Rite 8200 (integrating sphere spectro photometer, Product from X-Rite). The visible light region in the present invention means 400 to 700 nm.

The silicone laminated substrate used in the LED device of the present invention preferably has optical reflectance of 80% or more (80 to 100%), and more preferably 85 to 98% over entire visible light region after a thermal discoloration resistance test by heating at temperature of 200° C. for 23 hours.

Glass Cloth

Glass cloth is not specifically restricted and can be used as known glass cloth such as quartz glass cloth, non-alkali glass cloth and T glass cloth having high tensile strength. The glass cloth is in the form of sheet and thickness thereof may be selected according to intended use of the silicone laminated substrate of the present invention and is not specifically restricted, but e.g. 10 to 2,000 μm, preferably 10 to 1,000 μm, and more preferably 20 to 300 μm. In the silicone laminated substrate of the present invention, the thickness of the glass cloth may be selected according to an intended use of the silicone laminated substrate and is not specifically restricted, but preferably 20 to 2,000 μm, and more preferably 50 to 1,000 μm.

Cured Product of Silicone Resin Composition

By impregnating the silicone resin composition containing the above described (A) to (D) components in a glass cloth to be cured, a cured product is filled in the above glass cloth to coat the glass cloth surface. In the silicone laminated substrate of the present invention, the cured product may coat only one or both surfaces of the glass cloth, but both surfaces of the glass cloth are preferably coated. The thickness of the cured product that coats the glass cloth surface may be selected according to an intended use of the silicone laminated substrate of the present invention and is not specifically restricted, but preferably 20 to 2,000 μm, and more preferably 50 to 1,000 μm. In the silicone laminated substrate of the present invention, the thickness of the cured product that coats the glass cloth surface may be selected according to an intended use of the silicone laminated substrate of the present invention and is not specifically restricted, but preferably 50 to 2,000 μm, and more preferably 60 to 1,000 μm.

Method for Producing a Silicone Laminated Substrate

The silicone laminated substrate of the present invention can be obtained by the steps of:

impregnating a silicone resin composition containing the above (A) to (D) components in a solvent with dissolved and dispersed in a glass cloth;

removing the solvent from the glass cloth by evaporation; and heat-curing the silicone resin composition impregnated in the glass cloth under pressurized molding. Herein, the silicone laminated substrate of the present invention can be obtained by using a filler containing 600 parts by mass or less of the (D1) component relative to 100 parts by mass totaling the (A) and (B) components and, as required, 1 to 300 parts by mass of the (D2) component relative to 100 parts by mass totaling (A) and (B) components as the (D) component.

—Solvent—

A solvent is not specifically restricted as long as the silicone resin composition as described above can be dissolved and dispersed and the composition can be evaporated at a temperature so that the silicone resin composition can remain uncured or semi-cured, e.g. a solvent whose boiling point is 50 to 200° C., preferably 80 to 150° C. When a silicone laminated substrate for an LED device is produced, the silicone resin composition as described above can be dissolved and dispersed and the composition is not specifically restricted as long as it can be evaporated at a temperature so that the composition can remain uncured or semi-cured, e.g. a solvent whose boiling point is 50 to 150° C., preferably 60 to 100° C. Illustrative example of the solvent includes hydrocarbon non-polar solvents such as toluene, xylene, hexane, and heptane, and ethers. The amount of the solvent to be used is not specifically restricted as long as the silicone resin composition as described above is solvent-dispersed and a solution obtained or a dispersion liquid can be impregnated in a glass cloth, preferably 10 to 200 parts by mass relative to 100 parts by mass of the silicone resin composition, more preferably 20 to 100 parts by mass. When a silicone laminated substrate for an LED device is produced, the solvent is not specifically restricted as long as the silicone resin composition as described above is dissolved and dispersed and a solution or a dispersion liquid obtained can be impregnated in a glass cloth, preferably 10 to 200 parts by mass relative to 100 parts by mass of the silicone resin composition, and more preferably 50 to 100 parts by mass.

A solution or a dispersion liquid of the silicone resin composition as described above can be impregnated in a glass cloth by infiltrating e.g. a glass cloth in the solution or the dispersion liquid, or applying the solution on one or both surfaces of the glass cloth using a dip device.

The solvent can be evaporated by leaving unattended a glass cloth having the silicone resin composition as described above impregnated with dissolved and dispersed in the solvent at preferably 50 to 150° C., and more preferably 60 to 100° C. A heating device such as an oven or a drier may be used accordingly.

The silicone resin composition can be heating-cured under pressurized molding using thermal pressing machine or vacuum pressing machine under pressure preferably 1 to 100 MPa, more preferably 5 to 50 MPa at preferably at the temperature of 50 to 200° C., and more preferably at the temperature of 70 to 180° C. The pressure molding time is preferably 10 to 150 minutes, and more preferably 40 to 120 minutes. The silicone resin composition can be subjected to post cure at 50 to 200° C., particularly 70 to 180° C. for 0.1 to 10 hours, particularly 1 to 4 hours.

LED Device

The LED device of the present invention has the silicone laminated substrate of the present invention and an LED chip mounted on the substrate. FIG. 1 is a sectional view showing one example of the LED device of the present invention. In an LED device 1 shown in FIG. 1, an electrode pattern 3 composed of an anode and a cathode is formed on a silicone laminated substrate 2 of the present invention and an LED chip 5 is die-bonded to one electrode of the electrode pattern via a die bonding paste 4. A bonding wire 6 is connected between the LED chip 5 and another electrode of the electrode pattern 3. Part of the electrode pattern 3, the LED chip 5 and the bonding wire 6 are sealed by a transparent sealing member 7.

The electrode pattern 3 can be produced by a known method, e.g. etching of a copper foil-laminated substrate having the silicone laminated substrate 2 of the present invention and copper foils provided one or both surfaces of the substrate 2. Illustrative example of the die bonding paste 4 includes a silver paste. Illustrative example of the bonding wire 6 includes a gold wire. The transparent sealing member 7 can be placed by molding a known sealant such as a silicone sealant and an epoxy sealant into a desired shape to be cured accordingly.

EXAMPLES

The present invention will be described in detail with reference to Synthetic Examples, Examples and Comparative Examples, but the present invention is not restricted to the following Examples. The weight average molecular weight in the following Examples is the value converted into polystyrene measured by gel-permeation chromatography (GPC).

Synthetic Example 1

—An Organopolysiloxane Resin Containing a Vinyl Group (A1)—

After organosilanes represented by $PhSiCl_3$ (562.1 g, 90 mole %) and $V_iS_iCl_3$ (47.8 g, 10 mole %) were dissolved into a toluene solvent, added dropwise into water, subjected to co-hydrolysis, washed with water and alkaline for neutralization and dehydrated, the solvent was stripped to synthesize a resin with a 3-dimensional network structure containing a vinyl group composed of a T unit (A1). The weight average molecular weight of the resin was 4000, and the amount of vinyl group content was 0.08 mole/100 g.

Synthetic Example 2

—An Organopolysiloxane Resin Containing a Vinyl Group (A2)—

After organosilanes represented by $PhSiCl_3$ (499.6 g, 80 mole %) and $V_iS_iCl_3$ (95.6 g, 20 mole %) were dissolved into a toluene solvent, added dropwise into water, subjected to co-hydrolysis, washed with water and alkaline for neutralization and dehydrated, the solvent was stripped to synthesize a resin with a 3-dimensional network structure containing a vinyl group composed of a T unit (A2). The weight average molecular weight of the resin was 4200, and the amount of vinyl group content was 0.14 mole/100 g.

Synthetic Example 3

—An Organohydrogenpolysiloxane Resin Containing a Hydrosilyl Group (B1)—

After organosilanes represented by $PhSiCl_3$ (666.8 g, 81.8 mole %), $ClMe_2SiO(Me_2SiO)_8SiMe_2Cl$ (278.6 g, 9.1 mole %) and $MeHSiCl_2$ (40.3 g, 9.1 mole %) into a toluene solvent, added dropwise into water, subjected to co-hydrolysis, washed with water and alkaline for neutralization and dehydrated, the solvent was stripped to synthesize a resin containing a hydrosilyl group (B1). The weight average molecular weight of the resin was 11000, and the amount of hydrosilyl group content was 0.05 mole/100 g.

Synthetic Example 4

—An Organohydrogenpolysiloxane Resin Containing a Hydrosilyl Group (B2)—

After organosilanes represented by $PhSiCl_3$ (666.8 g, 81.8 mole %), $ClMe_2SiO(Me_2SiO)_8SiMe_2Cl$ (278.6 g, 9.1 mole %) and $Me_2HSiCl$ (31.6 g, 9.1 mole %) were dissolved into a toluene solvent, added dropwise into water, subjected to co-hydrolysis, washed with water and alkaline for neutralization and dehydrated, the solvent was stripped to synthesize a resin containing a hydrosilyl group (B2). The weight average molecular weight of the resin was 9000, and the amount of hydrosilyl group content was 0.05 mole/100 g.

Example 1

The resin containing a vinyl group (A1) obtained in the Synthetic Example 1 (71 g), the resin containing a hydrosilyl group (B1) obtained in the Synthetic Example 3 (129 g), an acetylene alcohol-based ethynylmethyldecylcarbinol (as a reaction inhibitor) (0.2 g) and 1% by mass of an octyl alcohol solution of chloroplatinic acid (0.2 g) were mixed and completely agitated to obtain a base composition. A toluene (290 g) was added to the base composition as a solvent and an alumina (Product from Admatechs Company Limited: ADMAFINE AO-502, average particle size: approx. 0.7 μm) (395 g) and a titanium oxide (Product from ISHIHARA SANGYO KAISHA, LTD.: PF-691, average particle size: approx. 0.2 μm) (10 g) were added thereto and agitated with a Thinky conditioning mixer to prepare a toluene dispersion liquid of the silicone resin composition.

By infiltrating a glass cloth (Product from Nitto Boseki Co., Ltd., thickness: 100 μm) into the toluene dispersion liquid, the toluene dispersion liquid was impregnated in the glass cloth. The toluene was evaporated by leaving unattended the glass cloth at 80° C. for 8 minutes. Both surfaces of the glass cloth after evaporating the toluene were provided with a solid film formed at room temperature. The glass cloth was subjected to pressure molding with a thermal pressing machine at 160° C. for 20 minutes and then at 200° C. for 70 minutes to obtain a silicone laminated substrate. The glass cloth was pinched between two copper foils (Product from Furukawa Electric Co., Ltd., thickness: 35 μm) and subjected to pressure molding with a thermal pressing machine at 160° C. for 20 minutes and then at 200° C. for 70 minutes to obtain a copper-clad laminated substrate.

Example 2

The conditions were same as Example 1 except for use of the resin containing a hydrosilyl group (B2) obtained in the Synthetic Example 4, as a replacement of the resin containing a hydrosilyl group (B1) obtained in the Synthetic Example 3 in Example 1 to obtain a silicone laminated substrate and a copper-clad laminated substrate.

Example 3

The conditions were same as Example 1 except for use of the resin containing a vinyl group (A2) obtained in the Synthetic Example 2 (53 g) and the resin containing a hydrosilyl group (B1) obtained in the Synthetic Example 3 (147 g), as a replacement of the resin containing a vinyl group (A1) obtained in the Synthetic Example 1 in Example 1 to obtain a silicone laminated substrate and a copper-clad laminated substrate.

Example 4

The conditions were same as Example 3 except for use of the resin containing a vinyl group (B2) obtained in the Synthetic Example 4, as a replacement of the resin containing a hydrosilyl group (B1) obtained in the Synthetic Example 3 in Example 3 to obtain a silicone laminated substrate and a copper-clad laminated substrate.

Comparative Synthesis Example 1

—Organopolysiloxane Resin Containing a Vinyl Group (A3)—

With reference to Examples described in Japanese Patent Publication Laid-Open No. 2010-89493, an organopolysiloxane resin containing a vinyl group (A3) that contains an organopolysiloxane other than a T unit structure represented by $RSiO_{1.5}$ was synthesized. As a synthesis method, after organosilanes represented by $PhSiCl_3$ (952.5 g, 81.6 mole %), $ClMe_2SiO(Me_2SiO)_8SiMe_2Cl$ (398.0 g, 9.1 mole %), $MeViSiCl_2$ (37.8 g, 4.8 mole %) and $Me_2ViSiCl$ (30.2 g, 4.5 mole %) were dissolved in a toluene solvent, added dropwise into water, subjected to co-hydrolysis, washed with water and alkaline for neutralization and dehydrated, the solvent was stripper to synthesize a resin containing a hydrosilyl group (A3). The weight average molecular weight of the resin was 14000, and the hydrosilyl group content was 0.05 mole/100 g.

Comparative Example 1

The conditions were same as Example 1 except for use of the resin containing a vinyl group (A3) that contains an organopolysiloxane other than a T unit structure, as a replacement of the resin containing a vinyl group with a 3-dimensional network structure composed of a T unit (A1) in Example 1 to obtain a silicone laminated substrate and a copper-clad laminated substrate.

Comparative Example 2

A thermal discoloration resistance test was performed using a commercially available white glass epoxy substrate, as a replacement of the silicone laminated substrate produced in Example 1.

1. Appearance

The silicone laminated substrate obtained was visually examined in surface uniformity, whether the surface is flat and smooth or uneven.

2. Glass Transition Temperature (Tg)

Using a toluene dispersion liquid of a silicone resin composition for producing a silicone laminated substrate prepared in each of the Examples and Comparative Examples, a silicone laminated substrate was heating-cured with a heated oven to obtain a sheet 1.0 mm thick, and the dynamic viscoelasticity was measured using a DMA device (Product from TA Instruments: Q800). The glass transition temperature was defined as a temperature showing the maximum tan δ at 1 Hz.

3. Linear Expansion Coefficient

After a copper foil of copper-clad laminated substrate obtained was removed by etching, the linear expansion coefficient in a direction perpendicular to the substrate (Z direction) was measured at a lower and higher temperature range than the glass transition temperature, using a thermo mechanical analysis TMA device (Product from Hitachi High-Tech Science Corporation: TMA/SS6100) according to JIS C 6484 standard.

4. Thermal Discoloration

After a copper foil of a copper-clad laminated substrate obtained was removed by etching, the reflectance at the average wavelength (470 nm) of a blue LED on the surface of the laminated substrate was measured using an optical reflectance measuring device X-Rite 8200 (integrating sphere spectro photometer, Product from X-Rite) and the reflectance after heating at 200° C. for 23 hours was measured as well.

The results are shown in Tables 1 and 2.

TABLE 1

|  |  | Example 1 | Example 2 | Example 3 | Example 4 | Comparative Example 1 |
|---|---|---|---|---|---|---|
| Organopolysiloxane resin containing a vinyl group | | A1 | A1 | A2 | A2 | A3 |
| Organopolysiloxane resin containing a hydrosilyl group | | B1 | B2 | B1 | B2 | B1 |
| Appearance | | Flat | Flat | Flat | Flat | Flat |
| Glass transition temperature (Tg) (° C.) | | 175 | 170 | 170 | 160 | 100 |
| Linear expansion coefficient (ppm/° C.) | <Tg | 30 | 45 | 50 | 50 | 60 |
| | >Tg | 90 | 110 | 175 | 190 | 270 |

As shown in Table 1, using the resin containing a vinyl group with a 3-dimensional network structure composed of a T unit according to the present invention, the glass transition temperature is significantly higher and the linear expansion coefficient is lower than a silicone resin composition for producing a conventional silicone laminated substrate having suppressed warp and deformation to obtain a silicone laminated substrate.

TABLE 2

|  |  | Example 1 | Comparative Example 2 |
|---|---|---|---|
| Thermal discoloration reflectance (%) (470 nm) | Before heat treatment | 89 | 83 |
| | After heat treatment | 88 | 24 |

As shown in Table 2, the silicone laminated substrate of the present invention is much more excellent in heat resistance than a generally-used epoxy substrate, and it is experimentally demonstrated that deterioration of a substrate due to heating when processing and increase in calorific value of an LED chip.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A silicone resin composition for producing a silicone laminated substrate by being impregnated in a glass cloth and cured therein, the silicone resin composition comprising:
    (A) an organopolysiloxane with a 3-dimensional network structure consisting of a T unit represented by an $RSiO_{1.5}$ unit (R is $R^1$ or $R^2$) and an $R^1SiO_{1.5}$ unit ($R^1$ represents a linear, a branched or a cyclic alkyl group having 1 to 10 carbon atoms and an aryl group having 6 to 10 carbon atoms) and an $R^2SiO_{1.5}$ unit ($R^2$ represents an alkenyl group having 2 to 8 carbon atoms);
    (B) an organohydrogenpolysiloxane consisting of an $R^1SiO_{1.5}$ unit, an $R^1{}_2SiO$ unit and an $R^1{}_aH_bSiO_{(4-a-b)/2}$ unit ($R^1$ is the same as before, "a" represents 0, 1 or 2, "b" represents 1 or 2, and a+b represents 2 or 3), wherein the molar ratio of a hydrogen atom bonded to a silicon atom in the (B) component relative to the total of the alkenyl group in the (A) component is 0.1 to 4.0;
    (C) a platinum group metal catalyst, wherein the amount is an effective amount; and
    (D) a filler, wherein the amount is from more than 0 parts by mass to 900 parts by mass or less relative to 100 parts by mass totaling the (A) and (B) components.

2. The silicone resin composition according to claim 1, wherein the glass transition temperature of a cured product of the silicone resin composition is 150° C. or more.

3. The silicone resin composition according to claim 1, wherein the $R^1$ represents a methyl group, an ethyl group, a propyl group, a cyclohexyl group or a phenyl group, and the $R^2$ represents a vinyl group or an allyl group.

4. The silicone resin composition according to claim 1, wherein either or both of the (A) and (B) components contain a silanol group.

5. The silicone resin composition according to claim 1, wherein the (B) component has a continuous $R^1{}_2SiO$ unit.

6. The silicone resin composition according to claim 1, wherein the (D) component contains either or both of (D1) and (D2):
    (D1) inorganic filler other than white pigment, wherein the amount is 600 parts by mass or less relative to 100 parts by mass totaling the (A) and (B) components; and
    (D2) white pigment, wherein the amount is 1 to 300 parts by mass relative to 100parts by mass totaling the (A) and (B) components.

7. The silicone resin composition according to claim 6, wherein the (D2) component is titanium dioxide or zinc oxide or combination thereof.

8. The silicone resin composition according to claim 1, wherein the silicone resin composition is in the form of a solid at room temperature.

9. A silicone laminated substrate having a glass cloth and a cured product of a silicone resin composition impregnated in the glass cloth, wherein the silicone resin composition is the silicone resin composition according to claim 1.

10. A method for producing a silicone laminated substrate, comprising the steps of:
    impregnating the silicone resin composition according to claim 1 in a glass cloth, wherein the silicone resin composition is dissolved and/or dispersed in a solvent;
    removing the solvent from the glass cloth by evaporation; and
    heat-curing the silicone resin composition impregnated in the glass cloth under pressurized molding.

11. An LED device comprising: the silicone laminated substrate according to claim 9; and an LED chip mounted on the silicone laminated substrate.

* * * * *